United States Patent [19]

Yu et al.

[11] 4,282,648
[45] Aug. 11, 1981

[54] CMOS PROCESS

[75] Inventors: Kenneth K. Yu, Portland; Mark T. Bohr, Aloha; Mark B. Seidenfeld, Portland, all of Oreg.

[73] Assignee: Intel Corporation, Santa Clara, Calif.

[21] Appl. No.: 133,580

[22] Filed: Mar. 24, 1980

[51] Int. Cl.³ ............................................. H01L 21/22
[52] U.S. Cl. ................... 29/571; 29/576 W; 148/1.5; 148/187; 357/42
[58] Field of Search .............. 29/571, 576 W; 357/42; 148/187, 1.5

[56] References Cited

U.S. PATENT DOCUMENTS

| | | | |
|---|---|---|---|
| 3,996,657 | 12/1976 | Simko et al. | 29/571 |
| 4,013,484 | 3/1977 | Boleky et al. | 148/175 X |
| 4,013,489 | 3/1977 | Oldham | 29/571 X |
| 4,033,026 | 7/1977 | Pashley | 29/578 X |
| 4,052,229 | 10/1977 | Pashley | 148/1.5 |
| 4,139,935 | 2/1979 | Bertin et al. | 29/571 |
| 4,151,635 | 5/1979 | Kashkooli et al. | 29/571 |
| 4,178,674 | 12/1979 | Liu et al. | 29/571 |
| 4,246,044 | 1/1981 | Yanase | 148/187 X |

Primary Examiner—G. Ozaki
Attorney, Agent, or Firm—Blakely, Sokoloff, Taylor & Zafman

[57] ABSTRACT

A CMOS Process for fabricating channel stops which are substantially formed as a by-product of growing a field oxide is described. A p-type region is formed at an edge (or edges) of an n-type well through an opening in a silicon nitride layer. An oxide is grown at the opening. As the oxide grows, n-type dopant from the n-type well accumulates at the edge of the oxide, forming a more highly doped n-type region. Simultaneously, an adjacent p-type region is formed under the oxide from the p-type dopant. The process also permits easy fabrication of a buried contact to the p-channel device thus eliminating the need for a metal contact when forming a bistable circuit.

11 Claims, 10 Drawing Figures

CMOS PROCESS

BACKGROUND OF THE INVENTION

1. Field of the Invention

The invention relates to the field of CMOS processes and CMOS fabrication techniques.

2. Prior Art

Complementary, metal-oxide-semiconductor (CMOS) transistors also known as COS/MOS transistors are well known in the art and are frequently used in applications requiring low power. Moreover, CMOS field-effect transistors are characterized by their high switching speeds and their very high noise immunity over a wide range of power supply voltages making them useful in many applications.

Recently it has been discovered that in high density MOS circuits (using n-channel or p-channel devices) ionized particles traveling through the substrate can cause failures. Most typically alpha particles generate free minority carriers which, for example, tend to drift under the gates of active devices disturbing charge patterns. The resulting failures, often referred to as "soft failures," become more troublesome as densities increase. CMOS circuits, however, are substantially immune to these type of failures and for this reason CMOS technology has become more important for high density applications.

In the fabrication of CMOS devices, channel stops (also referred to as "guard bands" or isolation regions) are formed in the substrate surrounding active devices. These regions are typically highly doped "frames" of the same conductivity type as the host region for the active device. They are used to reduce leakage between neighboring devices such as that caused by spurious MOS action. This MOS action often results from potentials on interconnecting lines, and the like.

In one commonly employed process for fabricating CMOS devices, wells (such as p-wells) are first formed. Then with another masking operation, the n-channel devices are fabricated in the p-wells along with the n-channel stops. Following this, an additional masking step is used to define p-channel devices and p-channel stops. The channel stops, of necessity, must be spaced apart from the active devices.

In U.S. Pat. No. 4,013,484 an improved process is described for forming CMOS channel stops. With this process, the channel stops are fabricated in alignment with each other and in alignment with the active devices, without extra masking steps. These stops are contiguous with each other and with a source or drain region of the active devices, permitting high density fabrication.

The presently invented and described CMOS process has the advantage over prior art CMOS processing in that the channel stops are formed as a byproduct of forming field oxide regions. Thus, a substantial amount of processing is saved when compared to prior art processes. Additionally, the described process lends itself to fabricating a static memory cell (bistable circuit) without metal contacts.

SUMMARY OF THE INVENTION

A process for forming an isolation region or channel stop in a substrate which includes an n-type region or n-well is described. An opening is formed through a silicon nitride ($Si_3N_4$) layer; this opening is formed at the peripheral area of the n-well. A p-type dopant is used to dope the substrate through the opening. Then, a field oxide is grown on the substrate at the opening. The growth of this oxide forms an n-type region adjacent to the n-well from accumulated n-type dopant from the n-well. A p-type region is also formed adjacent to the n-type region from the p-type dopant remaining from the doping step. In this manner, n type and p type isolation regions are simultaneously formed during the growth of the field oxide.

DETAILED DESCRIPTION OF THE INVENTION

A complementary metal-oxide-semiconductor (CMOS) process is described. The process permits the fabrication of an isolation region (channel stop) comprising an n-type region and adjacent p-type region. These regions are simultaneously formed during the growth of a field oxide.

In the following description numerous specific details are set forth to provide a thorough understanding of the present invention. It will be obvious to one skilled in the art that the process may be practiced without these specific details. In other instances, well-known steps such as masking steps and cleaning steps, are not described in detail in order not to obscure the present invention in unnecessary detail.

Figure 1:
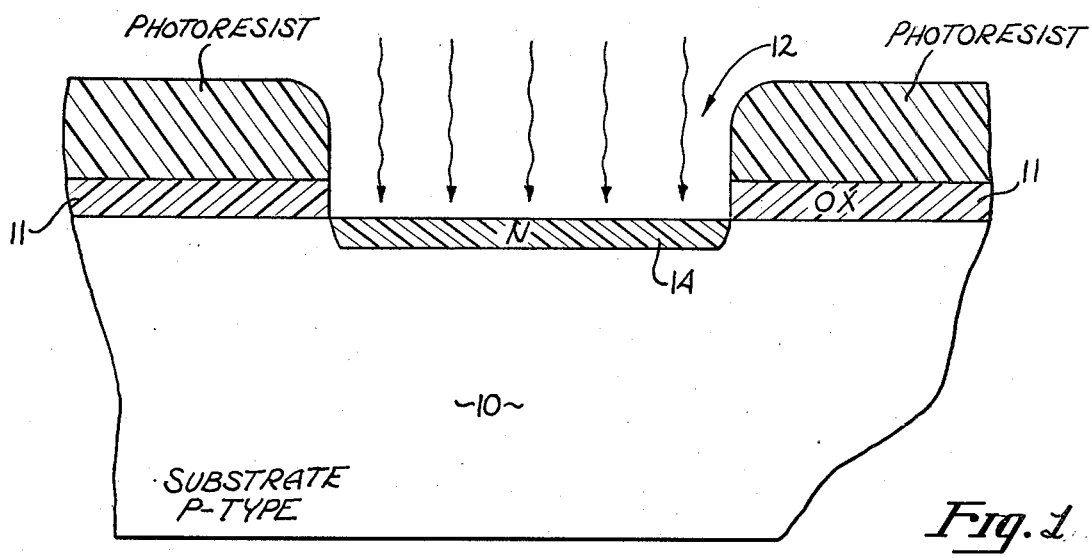
FIG. 1 is a cross-sectional, elevational view of a substrate illustrating the formation of a n-type well in the substrate.

Referring now to FIG. 1, in the presently preferred process a p-type monocrystalline silicon substrate 10 is employed; this substrate is doped to a level of 60 ohm-cm. An n-type well (n-type region 14) is formed in the substrate, the p-channel transistors are fabricated within this well. (This is somewhat a departure from many prior art processes in that the starting material is p-type silicon rather than n-type silicon)

First an oxide layer 11 (silicon dioxide) of approximately 550 Å thick is grown on the substrate. Then, through an ordinary masking step and etching step an opening 12 is formed through a photoresist layer and the oxide layer 11. This opening defines a substrate region for the n-type well 14. In the presently preferred embodiment, phosphorous is ion implanted to a level of $4.0\times10^{12}$ at an energy level of 50 KEV to from the n-wells.

Figure 2:
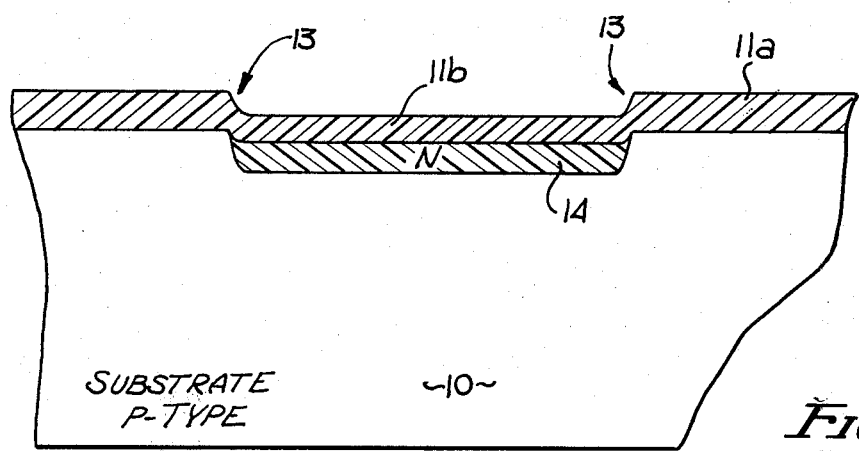
FIG. 2 illustrates a substrate of FIG. 1 after the regrowth of an oxide over the n-type well.

Next, the oxide is regrown on the surface of the substrate as shown in FIG. 2 after removal of the photoresist. The oxide over the region 14 grows more quickly than over those regions where the silicon is protected by the oxide layer 11. While the oxide thicknesses are not critical, an oxide layer of approximately 550 Å is grown over the region 14 (layer 11b) which results in a thickening of oxide over the remaining regions (such as shown by layer 11a) to approximately 850 Å.

The regrowth of the oxide after the formation of well 14 results in the formation of the edges 13 which delineate the periphery of the n-type well. This is of great value since it enables relatively easy mask alignment with the well during subsequent processing.

Figure 3:
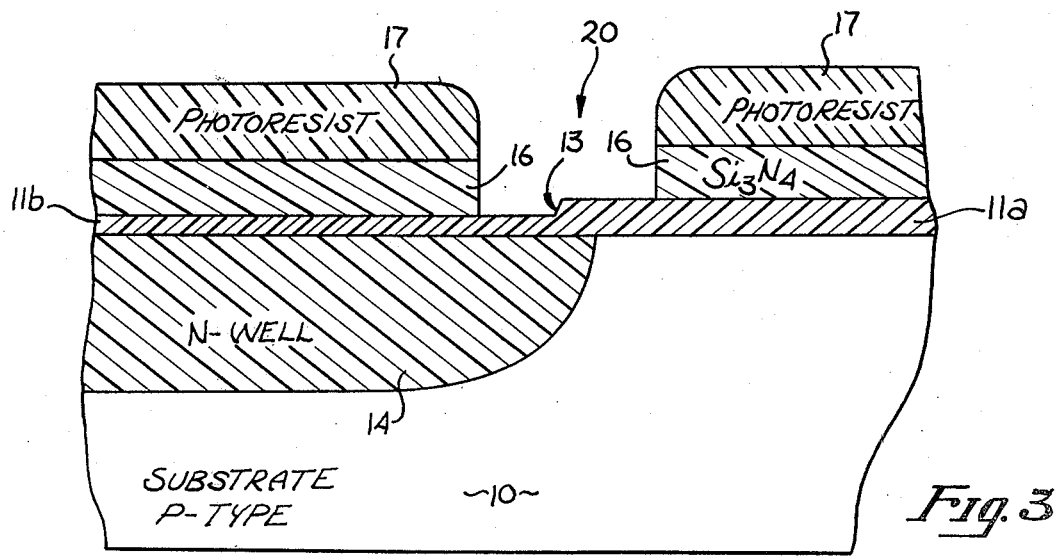
FIG. 3 illustrates the substrate of FIG. 2 after a drive step and the formation of an opening in a $Si_3N_4$ layer.

Now silicon nitride ($Si_3N_4$) layer 16 approximately 1000 Å thick is deposited over the oxide layers 11a and 11b. Then the substrate is subjected to a high temperature drive step to diffuse the n-type dopant into the substrate, thereby defining the deep well 14 shown in FIG. 3, (note that for the elevational view of FIGS. 3 through 9, the substrate has been shifted to the left to better illustrate the edge of the well).

Next, with ordinary masking and etching an opening 20 is defined at the periphery of the well 14 through the photoresist 17 and silicon nitride layer 16. The edges 13 of the oxide layers permit proper masking alignment (as mentioned) to assure that the edge (or edges) of the well 14 lies within the opening 20.

Figure 4:
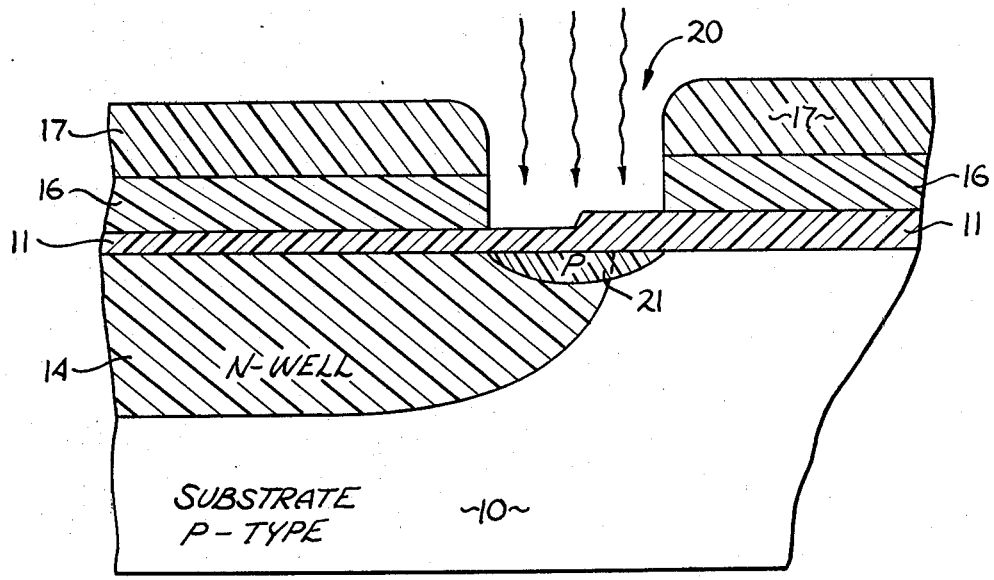
FIG. 4 illustrates the substrate of FIG. 3 during a doping step.

Then, as shown in FIG. 4, the opening 20 is used to form the p-type region 21. As presently preferred, ion implantation of boron to a dose of $1\times10^{13}$ cm$^{-2}$ is used. The region 21 intersects the edge of the well 14; the p-type dopant from region 21 substantially eliminating the edge (n-type region) of the well 14.

A field oxide layer 27 is now grown on the substrate. As is well-known, the silicon nitride layer 16 prevents the growth of the oxide, and thus the oxide grows primarily in the opening 20 for the illustrated portion of the substrate. By way of example, the oxide may be grown in a wet oxygen atmosphere at a temperature of 920° C. for 12 hours. As presently preferred, the oxide layer 27 is grown to a thickness of approximately 1.2 microns.

Figure 5:
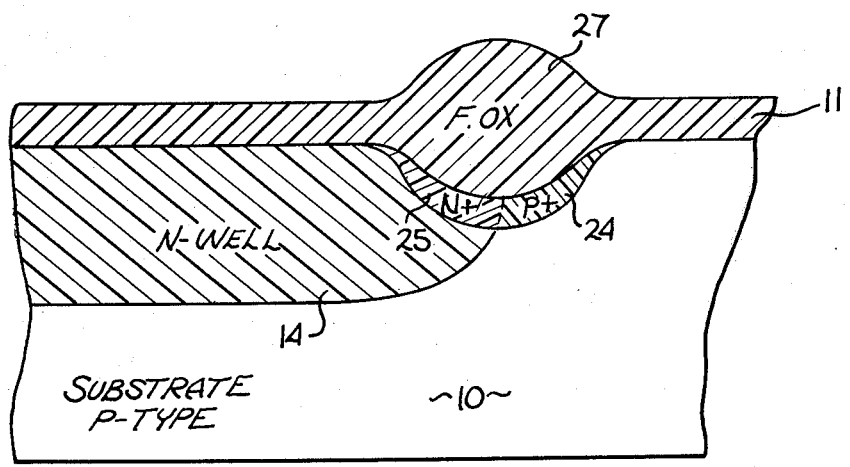
FIG. 5 illustrates the substrate of FIG. 4 after the formation of a field oxide.

As the oxide layer 27, illustrated in FIG. 5, grows into the n-type well 14, the phosphorous dopant within this well is piled-up against the edge of the oxide. The phosphorous dopant does not readily diffuse into the oxide as does boron. Thus, the region 25 shown in FIG. 5 is formed which has a higher dopant concentration (of n-type dopant) than the well. While boron does diffuse into the oxide as it grows, sufficient boron remains from the region 21 to form the region 24. Therefore, with the growth of the oxide region 27, the contiguous regions 24 and 25 are formed. These regions provide a channel stop or isolation region which importantly is formed with minimum processing and, in effect, as a by-product of the field oxide formation.

Figure 6:
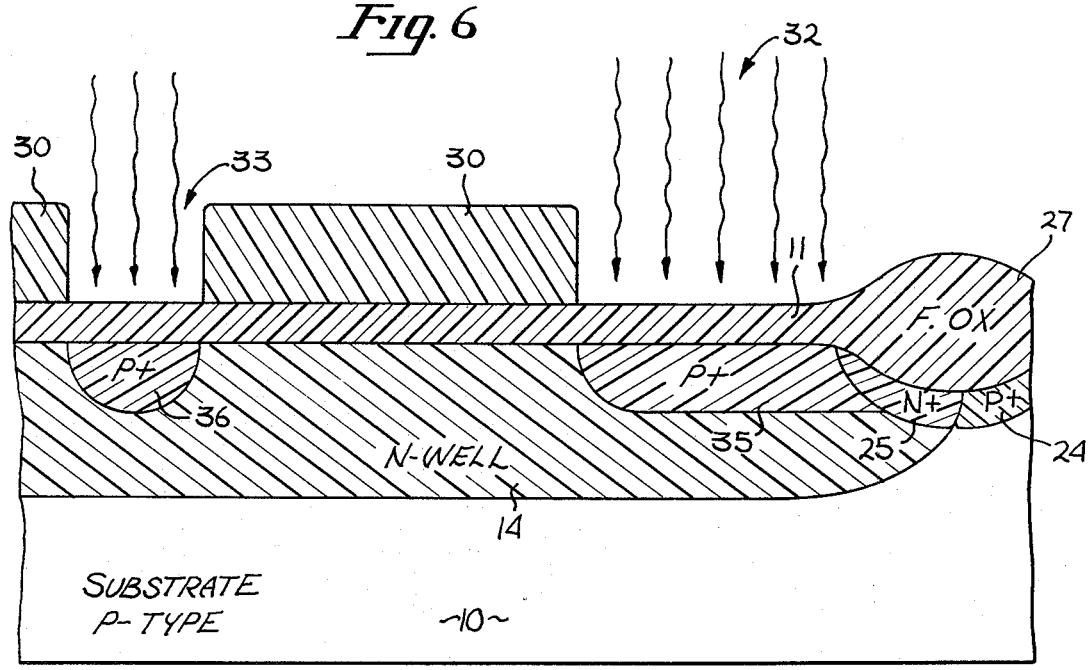
FIG. 6 illustrates the substrate of FIG. 5 after a masking step and during a doping step. This doping step is used to form the source and drain regions for a p-channel transistor.
Figure 7:
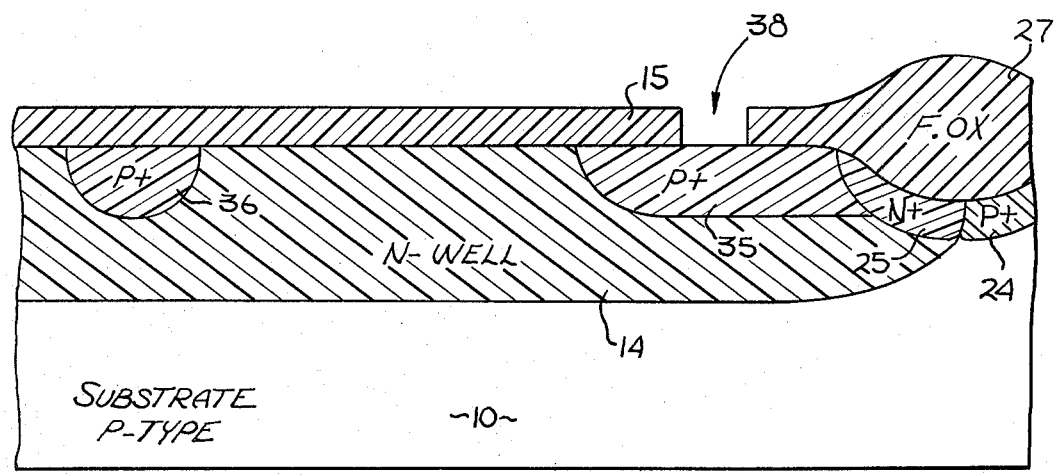
FIG. 7 illustrates the substrate of FIG. 6 after an opening has been formed for a buried contract in one of the p-type regions.
Figure 8:
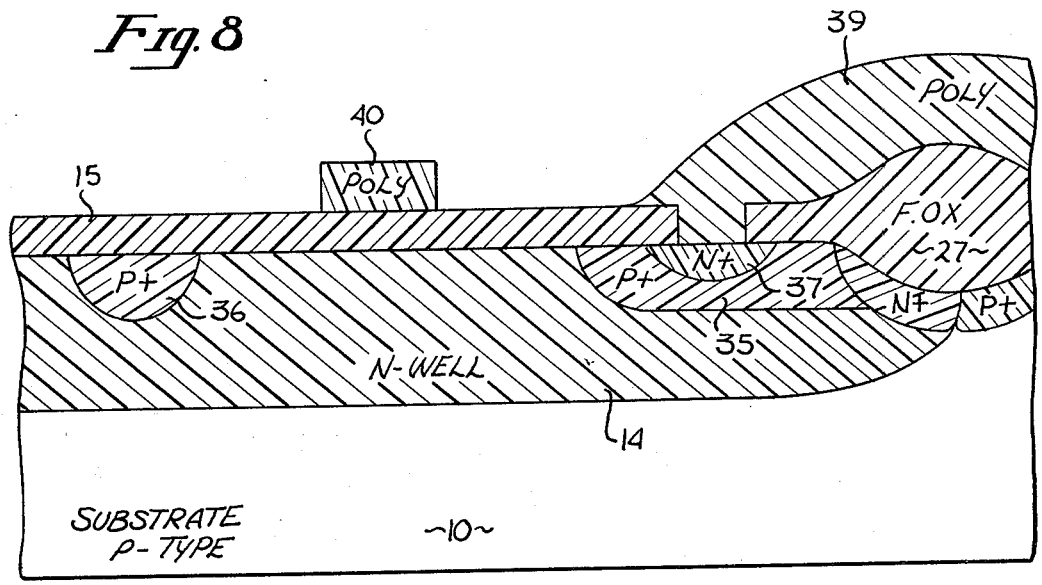
FIG. 8 illustrates the substrate of FIG. 7 after a polysilicon layer has been formed on the substrate and patterned.

Referring now to FIG. 6, an ordinary masking step is used to etch a photoresist layer 30, thereby defining the openings 32 and 33. These openings are used to form source and drain regions for the p-channel device. Boron is ion implanting through the openings, thus forming regions 35 and 36. (A dose of $5\times10^{15}$ cm$^{-2}$ is currently preferred.)

In the presently preferred embodiment, after removal of the photoresist layer 30, the oxide layers 11a and 11b are stripped, and a gate oxide layer 15 is grown on the substrate. This new oxide is approximately 400 Å thick for the presently preferred embodiment. An opening 38 (FIG. 7) is then etched through layer 15 to expose an area of region 35 using ordinary masking and etching.

A layer of polycrystalline silicon approximately 5500 Å thick is next formed over the substrate. This polysilicon is doped with phosphorus. The polysilicon is then patterned to define elements for the integrated circuit such as the gate member 40 and the line 39 shown in FIG. 8. The gate member 40 is spaced-apart from the regions 35 and 36 by approximately 3.5 microns in the presently preferred embodiment. The line 39 contacts the p-type region 35 through the opening 38. The n-type dopant from this polysilicon member diffuses into the region 35 forming an n-type region 37 within region 35.

Figure 9:
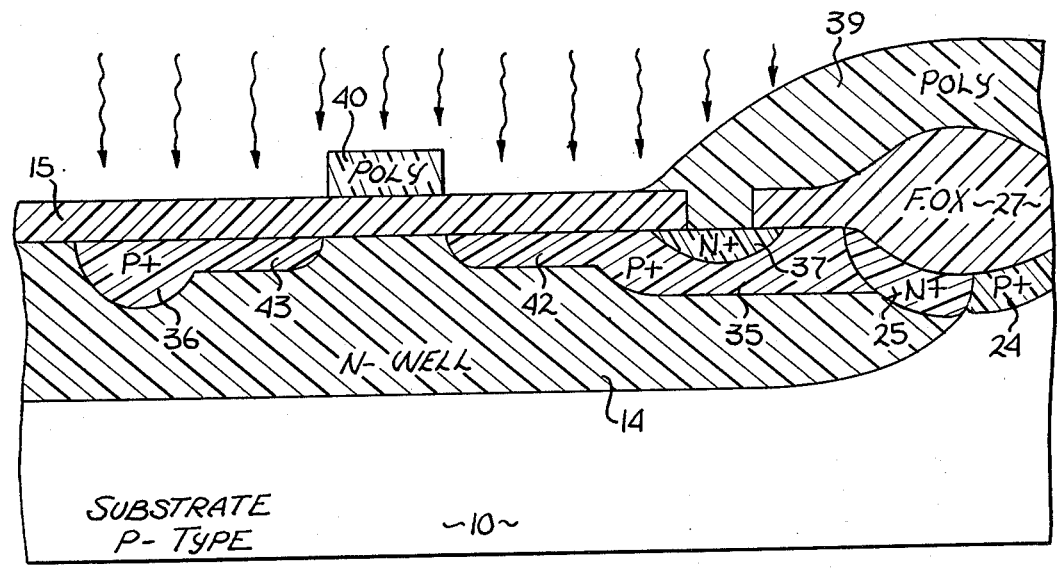
FIG. 9 illustrates the substrate of FIG. 8 during a doping step.

As shown in FIG. 9, the substrate is subjected to a boron implant to a level of approximately $1\times10^{14}$ cm$^{-2}$. This implant forms the p-type "bridge" regions 42 and 43. These regions are formed in alignment with the gate member 40 and extend the primary source and drain regions 35 and 36 to the edges of gate member 40. Only boron from the more lightly doped regions 42 and 43 laterally diffuses (during subsequent processing) beneath the gate member 40. Since the dopant concentration in regions 42 and 43 is much less than that associated with regions 35 and 36, much less dopant diffuses beneath the gate. Thus, the Miller capacitance of the p-channel device shown in FIG. 9 is reduced.

It will be apparent to one skilled in the art that well-known processing steps may be employed to fabricate the n-channel device for the CMOS circuit above described and that these devices may be fabricated simultaneously with the fabrication of the p-channel device shown in FIG. 9.

Figure 10:
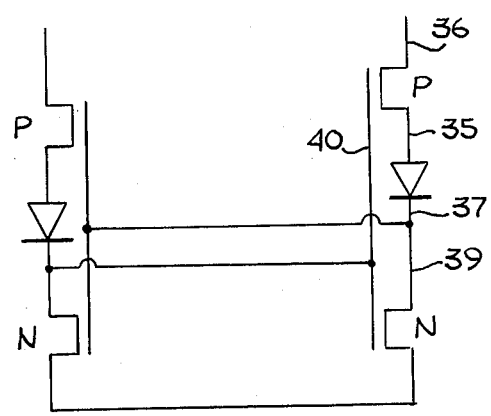
FIG. 10 is a circuit diagram of a bistable memory cell fabricated with the process of the present invention.

Referring now to FIG. 10, a bistable circuit (flip-flop) which is commonly used in a static memory is shown. For the circuit of FIG. 10, the p-channel devices (loads) are connected to the n-channel devices through diodes. These diodes are defined by the junction between regions 35 and 37 of FIG. 9 (and a like junction in the other p-channel device which is simultaneously fabricated). The line 39 interconnects the region 37 to two gates of the four transistors in the bistable circuit and also to the drain region (not shown) of one n-channel device.

With the described process the region 37 (which, in effect, is a buried contact) provides a connection to the p-channel device of the bistable circuit. This contact is easily formed with the inverted process. This is in contrast to many prior art circuits where metal contacts must be used for this connection. The present invention allows these bistable circuits to be fabricated with less substrate area because of the elimination of the metal contacts.

Thus, a CMOS process has been described which among other things provides isolation regions or channel stops substantially as a by-product of the field oxide formation. The process enables the fabrication of bistable circuits without metal contacts. Moreover, p-channel devices are fabricated with the process having a minimum of Miller capacitance.

We claim:

1. In the fabrication of CMOS integrated circuits, a process for forming a channel stop in a substrate, which includes an n-type region and a silicon nitride layer, comprising the steps of:
- defining an opening through said silicon nitride layer, said opening being formed at a peripheral area of said n-type region;
- doping said substrate with a p-type dopant through said opening; and
- forming an oxide on said substrate at said opening, such that a first region is formed from accumulated n-type dopant from said n-type region and a second region is formed adjacent to said first region from p-type dopant from said doping step;
- whereby said first and second regions form a channel stop.

2. The process defined by claim 1 wherein said doping step comprises ion implanation with boron.

3. In the fabrication of CMOS integrated circuits, a process for forming an isolation region in a substrate comprising the steps of:
- forming an n-type well in said substrate;
- forming a layer of silicon nitride on said substrate;
- defining an opening in said silicon nitride, said opening overlying a portion of said well and a portion of said substrate adjacent to said well;
- doping said substrate through said opening with a p-type dopant; and
- forming an oxide on said substrate at said opening such that said formation of said oxide causes an accumulation of n-type dopant from said well under said oxide adjacent to a p-type region formed under said oxide,
- whereby said n-type region and adjacent p-type region under said oxide form an isolation region.

4. The process defined by claim 3 wherein said n-type well is formed by the steps of:
- forming an oxide layer on said substrate;
- etching said oxide layer to define a substrate region for said well.

5. The process defined by claim 4 including the additional steps of:
- regrowing an oxide layer over said well after said formation of said n-type well such that a misible edge is produced in said oxide which delineates said well, thereby permitting easier identification of said well during subsequent processing.

6. The process defined by claim 3 wherein said well is formed with a phosphorus dopant.

7. The process defined by claim 6 wherein said p-type dopant is boron.

8. A CMOS process for forming a p-channel transistor with an integral buried contact and channel stop, comprising the steps of:
- forming an n-type well in a substrate;
- doping a first region with a p-type dopant at the periphery of said n-type well;
- growing an oxide at said first region so as to form a channel stop comprising adjacent n-type and p-type regions;
- forming spaced-apart, p-type source and drain regions in said substrate within said n-type well for said p-channel transistor, one of said source and drain regions being adjacent to said n-type region of said channel stop;
- forming a polysilicon layer doped with an n-type dopant on said substrate, said polysilicon layer contacting one of said source and drain regions so as to form an n-type region within the said one of said source and drain regions; and
- pattering said polysilicon layer to form a gate member between said spaced-apart source and drain regions and a line in contact with the said one of said source and drain regions;
- whereby a p-channel transistor with an integral buried contact and channel stop is fabricated.

9. The process defined by claim 8 wherein said gate member is fabricated spaced-apart from said source and drain regions and where an additional doping step is employed to form two additional p-type regions more lightly doped than said source and drain regions which interconnect said source and drain regions to beneath opposite edges of said gate member.

10. The process defined by claim 9 wherein said first region is formed with a boron dopant.

11. The process defined by claim 10 wherein said n-type well is formed with a phosphorus dopant.

* * * * *